(12) United States Patent
Etou (10) Patent No.: US 6,789,247 B2
(45) Date of Patent: Sep. 7, 2004

(54) PRINTED BOARD DESIGNING APPARATUS, PRINTED BOARD DESIGNING METHOD, AND RECORDING MEDIUM ON WHICH CONTROL PROGRAM FOR PRINTED BOARD DESIGN IS RECORDED

(75) Inventor: Jyun Etou, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/114,255

(22) Filed: Apr. 3, 2002

(65) Prior Publication Data

US 2002/0157077 A1 Oct. 24, 2002

(30) Foreign Application Priority Data

Apr. 10, 2001 (JP) ........................................ 2001-111947

(51) Int. Cl.[7] ........................ G06F 17/50; H03K 17/693
(52) U.S. Cl. .......................................... 716/15; 716/12
(58) Field of Search .............................. 716/1, 5, 8, 13, 716/15, 17; 700/97, 297; 382/145; 345/441; 327/96, 211; 326/126; 219/130.33

(56) References Cited

U.S. PATENT DOCUMENTS 5,745,371 A * 4/1998 Shouen ........................ 716/15

6,321,131 B1 * 11/2001 Kumada et al. ............... 700/97

FOREIGN PATENT DOCUMENTS

| JP | 4-312176 A | 11/1992 | |
|----|-----------|---------|---------|
| JP | 5-067176 | * 3/1993 | .......... G06F/15/60 |
| JP | 10-293781 | * 11/1998 | .......... G06F/17/50 |

* cited by examiner

Primary Examiner—A. M. Thompson
Assistant Examiner—Helen Rossoshek
(74) Attorney, Agent, or Firm—Sughrue Mion, PLLC (57) ABSTRACT

A printed board designing apparatus and method is disclosed by which a printed circuit board which prevents occurrence of crosstalk with regard to various signals of high frequencies can be prevented. Signals to flow in each to adjacent ones of patterns are compared with each other in terms of the voltage, type and frequency, and occurrence of crosstalk is discriminated when the signals are different from each other in terms of at least one of the factors of the voltage, type and frequency. In a region of a display of the patterns in which the patterns between which occurrence of crosstalk is discriminated are positioned adjacent each other, a crosstalk possibility mark is displayed.

12 Claims, 8 Drawing Sheets

| VOLTAGE LEVEL | TYPE | FREQUENCY | DISCRIMINATION |
|---|---|---|---|
| DIFFERENT | DIFFERENT | DIFFERENT | ○ |
| DIFFERENT | DIFFERENT | SAME | ○ |
| SAME | DIFFERENT | DIFFERENT | ○ |
| DIFFERENT | SAME | DIFFERENT | ○ |
| DIFFERENT | SAME | SAME | ○ |
| SAME | DIFFERENT | SAME | ○ |
| SAME | SAME | DIFFERENT | ○ |
| SAME | SAME | SAME | × |

PRINTED BOARD DESIGNING APPARATUS, PRINTED BOARD DESIGNING METHOD, AND RECORDING MEDIUM ON WHICH CONTROL PROGRAM FOR PRINTED BOARD DESIGN IS RECORDED

BACKGROUND OF THE INVENTION

1. Field of the Invention

The present invention relates to a printed board designing apparatus, a printed board designing method and a control program for printed board design, and more particularly to a printed board designing apparatus and a printed board designing method suitable for use to design a printed board for a circuit in which a plurality of signals of different high frequencies flow and a recording medium on which a control program for printed board design is recorded.

2. Description of the Related Art

In design of a printed board, properties, materials and shapes are selected in accordance with a performance or a mounting method of an electronic equipment, and in recent years, the demanded level for them has become higher in order to increase the density of wiring lines and increase the number of layers. As a result of the increase of the density of wiring lines, printed boards having a pattern width smaller than 0.1 mm have been put into practical use while assuring a sectional area of a pattern. The distance between patterns depends upon a material used, whether or not a coating is present and an applied voltage. In a multilayer printed board, also it is important to examine the gap between a through-hole and an adjacent pattern. As other electric properties, the electric capacity, the characteristic impedance and the crosstalk are taken into consideration to design a pattern or determine a layer configuration of multiple layers, and a printed board is designed based on the determined details by a printed board designing apparatus.

Figure 7:
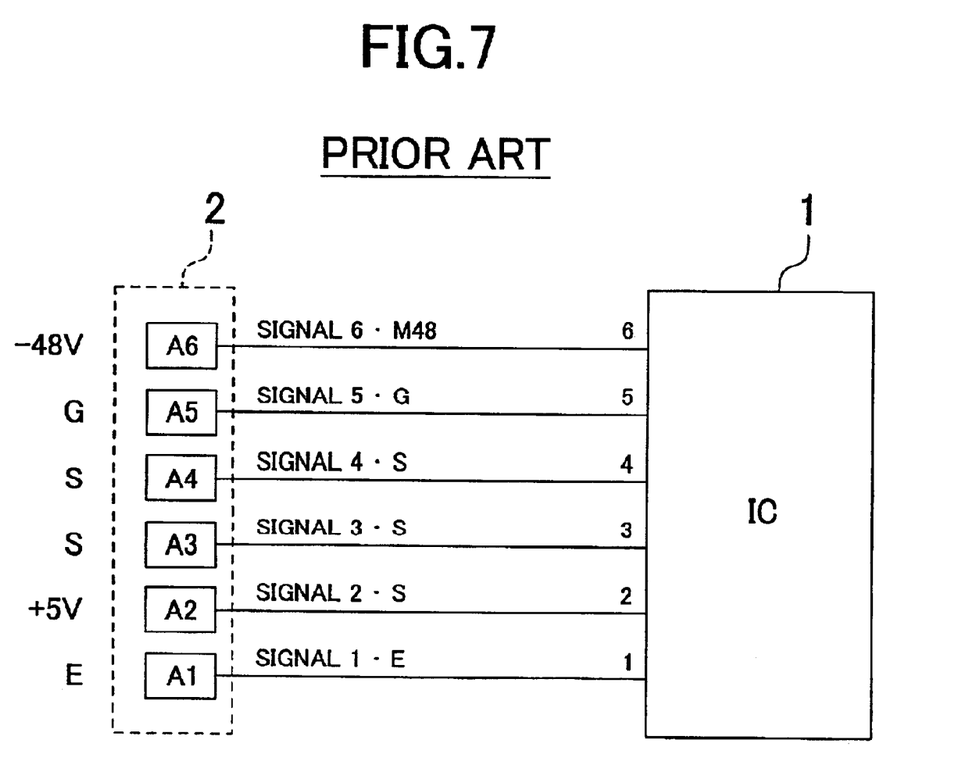
FIG. 7 is a diagrammatic view illustrating wiring line information of a circuit diagram used in a conventional printed board designing apparatus.

A printed board designing apparatus of the type mentioned is disclosed, for example, in Japanese Patent Laid-Open No. 312176/1992. FIG. 7 illustrates wiring line information of a circuit diagram used in the printed board designing apparatus disclosed in the document.

Referring to FIG. 7, pins "A1", "A2", "A3", "A4", "A5" and "A6" of a connector 2 are connected to input/output pins "1", "2", "3", "4", "5" and "6" of an integrated circuit (hereinafter referred to simply as "IC") 1. To a signal line between the input/output pin "1" and the pin "A1", a signal name "signal 1" and a voltage identification symbol "E" ("E" denotes a ground (earth) line) are applied. To a signal line between the input/output pin "2" and the pin "A2", a signal name "signal 2" and a voltage identification symbol "5" ("5" denotes a +5 V line) are applied. To a signal line between the input/output pin "3" and the pin "A3", a signal name "signal 3" and a voltage identification symbol "S" ("S" denotes a signal line) are applied. To a signal line between the input/output pin "4" and the pin "A4", a signal name "signal 4" and a voltage identification symbol "S" are applied. To a signal line between the input/output pin "5" and the pin "A5", a signal name "signal 6" and a voltage identification symbol "M48" ("M48" denotes a −48V line) are applied.

Figure 8:
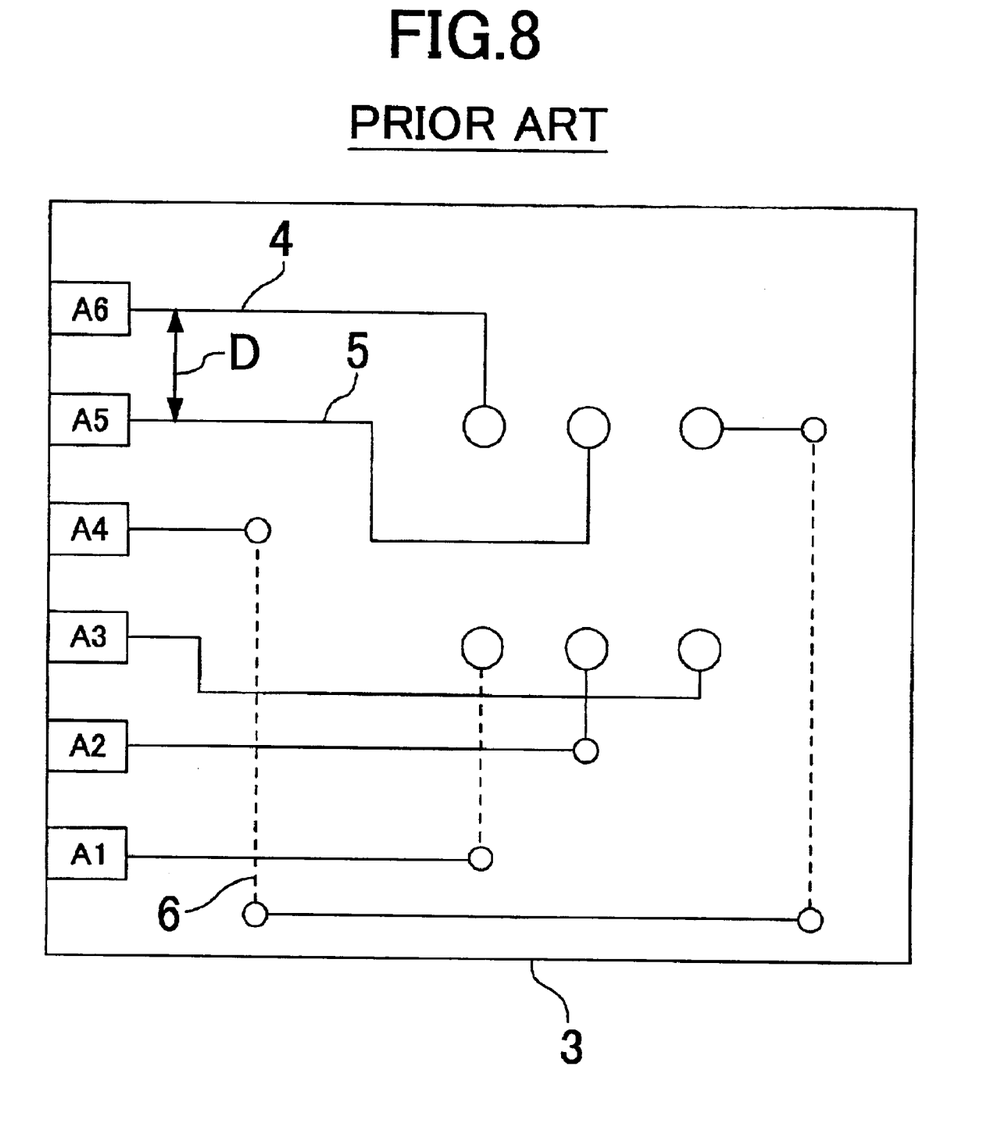
FIG. 8 is a diagrammatic view showing patterns of a printed board produced based on the wiring line information of FIG. 7.

FIG. 8 shows a pattern of a printed board produced based on the wiring line information of FI. 7 by the printed board designing apparatus described above.

Referring to FIG. 8, respective patterns are formed between the input/output pins "1", "2", "3", "4", "5" and "6" and the pins "A1", "A2", "A3", "A4", "A5" and "A6" on a printed board 3 shown based on the wiring line information of FIG. 7. In this instance, a potential difference between those patterns which are positioned adjacent each other upon wiring, for example, between the patterns 4 and 5, is calculated using the voltage identification symbols "E", "5", "S", "S", "G" and "M48", and a gap D necessary for prevention of crosstalk is provided based on the potential difference. Further, where a different pattern 6 is formed on the rear face of the printed board 3 such that it intersects with any other pattern formed already, a potential difference between the layers at the portion at which the patterns intersect with each other as viewed in a see-through fashion is calculated, and a gap necessary for prevention of crosstalk is provided based on the thus calculated potential difference.

However, the conventional printed board designing apparatus described above has the following problem.

In particular, according to the conventional printed board designing apparatus, crosstalk in the printed board 3 shown in FIG. 8 is prevented through the provision of a gap based on a potential difference between each adjacent patterns. However, in a printed board in the inside of an electronic equipment in recent years, various signals having higher frequencies than ever flow, and therefore, there is a problem that provision only of a gap provided based on a potential difference between each adjacent patterns cannot sufficiently prevent the crosstalk. Therefore, it is necessary to investigate prevention of crosstalk with regard to various signals of high frequencies in the stage of designing of a printed board.

SUMMARY OF THE INVENTION

It is an object of the present invention to provide a printed board designing apparatus, a printed board designing method and a recording medium having a control program for printed board design recorded thereon by which a printed circuit board which prevents occurrence of crosstalk with regard to various signals of high frequencies can be prevented.

In order to attain the object described above, according to an aspect of the present invention, there is provided a printed board designing apparatus for receiving a circuit diagram corresponding to information of wiring lines of a circuit and designing patterns corresponding to the individual wiring lines of the circuit diagram, comprising crosstalk occurrence discrimination means for comparing signals to flow in the patterns with each other in terms of a characteristic and discriminating occurrence of crosstalk when the signals are different from each other in terms of the characteristic, and display means for displaying the designed patterns and displaying a predetermined mark at a location of the display of the design patterns at which the crosstalk occurs.

The crosstalk occurrence discrimination means may comparing signals to flow in each two adjacent ones of the patterns with each other in terms of a voltage, a type and a frequency as the characteristic and discriminate occurrence of crosstalk when the signals are different from each other in terms of at least one of the factors of the voltage, type and frequency.

According to another aspect of the present invention, there is provided a printed board designing apparatus, comprising circuit diagram inputting means for inputting a circuit diagram corresponding to information of wiring lines of a circuit and applying, to each of the wiring lines in the circuit diagram, signal name data representative of a characteristic of a signal to flow in the wiring line, pattern designing means for designing patterns corresponding to the wiring lines based on the circuit diagram and applying the pertaining signal name data to the designed patterns, crosstalk occurrence discrimination means for comparing the signal name data corresponding to each two adjacent ones of the patterns and discriminating occurrence of crosstalk when the signal name data represent signals whose characteristics are different from each other, and display means for displaying the designed patterns and displaying a predetermined mark at a location of the display of the design patterns at which the crosstalk occurs.

According to a further aspect of the present invention, there is provided a printed board designing apparatus, comprising circuit diagram inputting means for inputting a circuit diagram corresponding to information of wiring lines of a circuit and applying, to each of the wiring lines in the circuit diagram, signal name data representative of a voltage, a type and a frequency of a signal to flow in the wiring line, pattern designing means for designing patterns corresponding to the wiring lines based on the circuit diagram and applying the pertaining signal name data to the designed patterns, crosstalk occurrence discrimination means for comparing the signal name data corresponding to each two adjacent ones of the patterns in terms of the voltage, type and frequency and discriminating occurrence of crosstalk when the signals are different from each other in terms of at least one of the voltage, type and frequency, and display means for displaying the designed patterns and the signal name data and displaying a predetermined mark at a location of the display of the design patterns at which the crosstalk occurs.

According to a still further aspect of the present invention, there is provided a printed board designing method for a printed board designing apparatus which receives a circuit diagram corresponding to information of wiring lines of a circuit and designs patterns corresponding to the individual wiring lines of the circuit diagram, comprising a crosstalk occurrence discrimination step of comparing signals to flow in the patterns with each other in terms of a characteristic and discriminating occurrence of crosstalk when the signals are different from each other in terms of the characteristic, and a displaying step of displaying the designed patterns and displaying a predetermined mark at a location of the display of the design patterns at which the crosstalk occurs.

In the crosstalk occurrence discrimination step, signals to flow in each two adjacent ones of the patterns may be with each other in terms of a voltage, a type and a frequency as the characteristic and occurrence of crosstalk may be discriminated when the signals are different from each other in terms of at least one of the factors of the voltage, type and frequency.

According to a yet further aspect of the present invention, there is provided a printed board designing method for a printed board designing apparatus, comprising a circuit diagram inputting step of inputting a circuit diagram corresponding to information of wiring lines of a circuit and applying, to each of the wiring lines in the circuit diagram, signal name data representative of a characteristic of a signal to flow in the wiring line, a pattern designing step of designing patterns corresponding to the wiring lines based on the circuit diagram and applying the pertaining signal name data to the designed patterns, a crosstalk occurrence discrimination step of comparing the signal name data corresponding to each two adjacent ones of the patterns and discriminating occurrence of crosstalk when the signal name data represent signals whose characteristics are different from each other, and a displaying step of displaying the designed patterns and displaying a predetermined mark at a location of the display of the design patterns at which the crosstalk occurs.

According to a yet further aspect of the present invention, there is provided a printed board designing method for a printed board designing apparatus, comprising a circuit diagram inputting step of inputting a circuit diagram corresponding to information of wiring lines of a circuit and applying, to each of the wiring lines in the circuit diagram, signal name data representative of a voltage, a type and a frequency of a signal to flow in the wiring line, a pattern designing step of designing patterns corresponding to the wiring lines based on the circuit diagram and applying the pertaining signal name data to the designed patterns, a crosstalk occurrence discrimination step of comparing the signal name data corresponding to each two adjacent ones of the patterns in terms of the voltage, type and frequency and discriminating occurrence of crosstalk when the signals are different from each other in terms of at least one of the voltage, type and frequency, and a displaying step of displaying the designed patterns and the signal name data and displaying a predetermined mark at a location of the display of the design patterns at which the crosstalk occurs.

According to a yet further aspect of the present invention, there is provided a recording medium on which a control program for a printed board designing apparatus which receives a circuit diagram corresponding to information of wiring lines of a circuit and designs patterns corresponding to the individual wiring lines of the circuit diagram is recorded, the control program comprising the steps of any of the printed board designing method for a printed board designing apparatus recited as above.

With the printed board designing apparatus, printed board designing method and recording medium, since the crosstalk occurrence discrimination means compares signals to flow in each two adjacent ones of patterns in terms of the voltage, type and frequency and discriminates occurrence of crosstalk when the signals are different from each other in at least one of the factors of the voltage, type and frequency and then the display means displays the predetermined mark representing the crosstalk, a printed board which prevents possible occurrence of crosstalk in a circuit in which various signals of high frequencies flow can be designed.

The above and other objects, features and advantages of the present invention will become apparent from the following description and the appended claims, taken in conjunction with the accompanying drawings in which like parts or elements are denoted by like reference symbols.

DESCRIPTION OF THE PREFERRED EMBODIMENT

Figure 1:
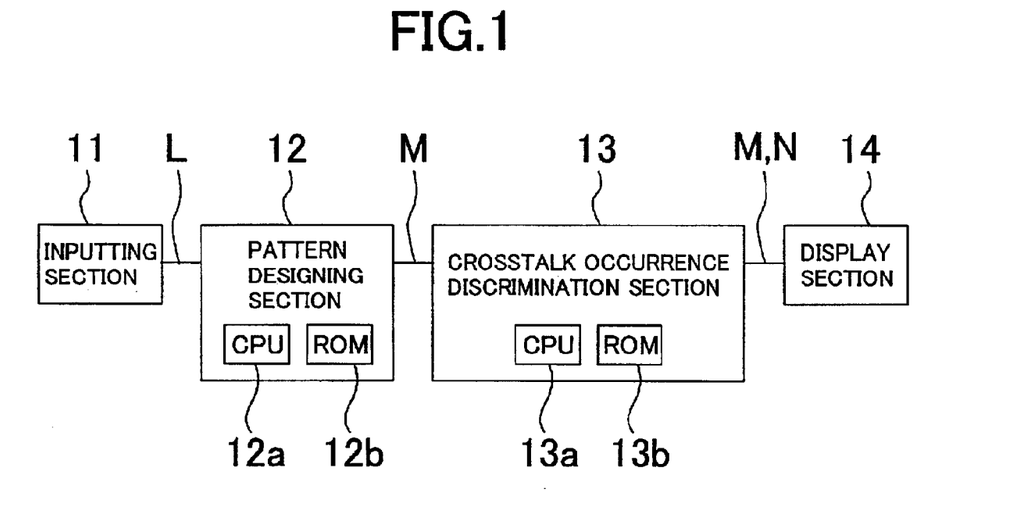
FIG. 1 is a block diagram showing a configuration of a printed board designing apparatus to which the present invention is applied.

Referring to FIG. 1, there is shown a configuration of a printed board designing apparatus to which the present invention is applied. The printed board designing apparatus is formed from, for example, a CAD (Computer Aided Design) apparatus or the like and includes an inputting section 11, a pattern designing section 12, a crosstalk occurrence discrimination section 13, and a display section 14.

The inputting section 11 is formed from, for example, a keyboard, a mouse and so forth and is used to input a circuit diagram corresponding to wiring line information of a circuit based on an operation of an operator. The inputting section 11 applies, to each of the wiring lines in the circuit diagram, signal name data representative of a voltage, a type and a frequency of a signal to flow in the wiring line and outputs circuit diagram data L representative of the signal name data. The pattern designing section 12 includes a central processing unit (hereinafter referred to simply as "CPU") 12a for controlling the entire pattern designing section 12 and a recording medium (such as, for example, a read-only memory, hereafter referred to as "ROM") 12b on which a control program for causing the CPU 12a to operate is recorded. The pattern designing section 12 receives the circuit diagram data L as input data thereto and designs patterns corresponding to the wiring lines in the circuit diagram such that no unnecessary inductance component or no unnecessary resistance component may be produced. Further, the pattern designing section 12 applies the signal name data to the individual patterns and outputs pattern design data M including the patterns and the signal name data.

The crosstalk occurrence discrimination section 13 includes a CPU 13a for controlling the entire crosstalk occurrence discrimination section 13 and a ROM 13b in which a control program for causing the CPU 13a to operate is recorded. The crosstalk occurrence discrimination section 13 receives the pattern design data M as input data thereto and compares signals to flow in each two adjacent ones of the patterns with each other in terms of the voltage, type and frequency. Then, if the signals are different from each other at least in one of the factors of the voltage, type and frequency, then the crosstalk occurrence discrimination section 13 discriminates occurrence of crosstalk and outputs the pattern design data M together with crosstalk data N representative of the crosstalk. The display section 14 is formed from, for example, a liquid crystal display unit and receives the crosstalk data N and the pattern design data M as input data thereto. The display section 14 thus displays the designed patterns and signal name data and displays a predetermined mark at a location of the patterns at which crosstalk occurs.

In the following, a printed board designing method executed by the printed circuit board designing apparatus described above is described with reference to FIGS. 2 to 6.

Figure 2:
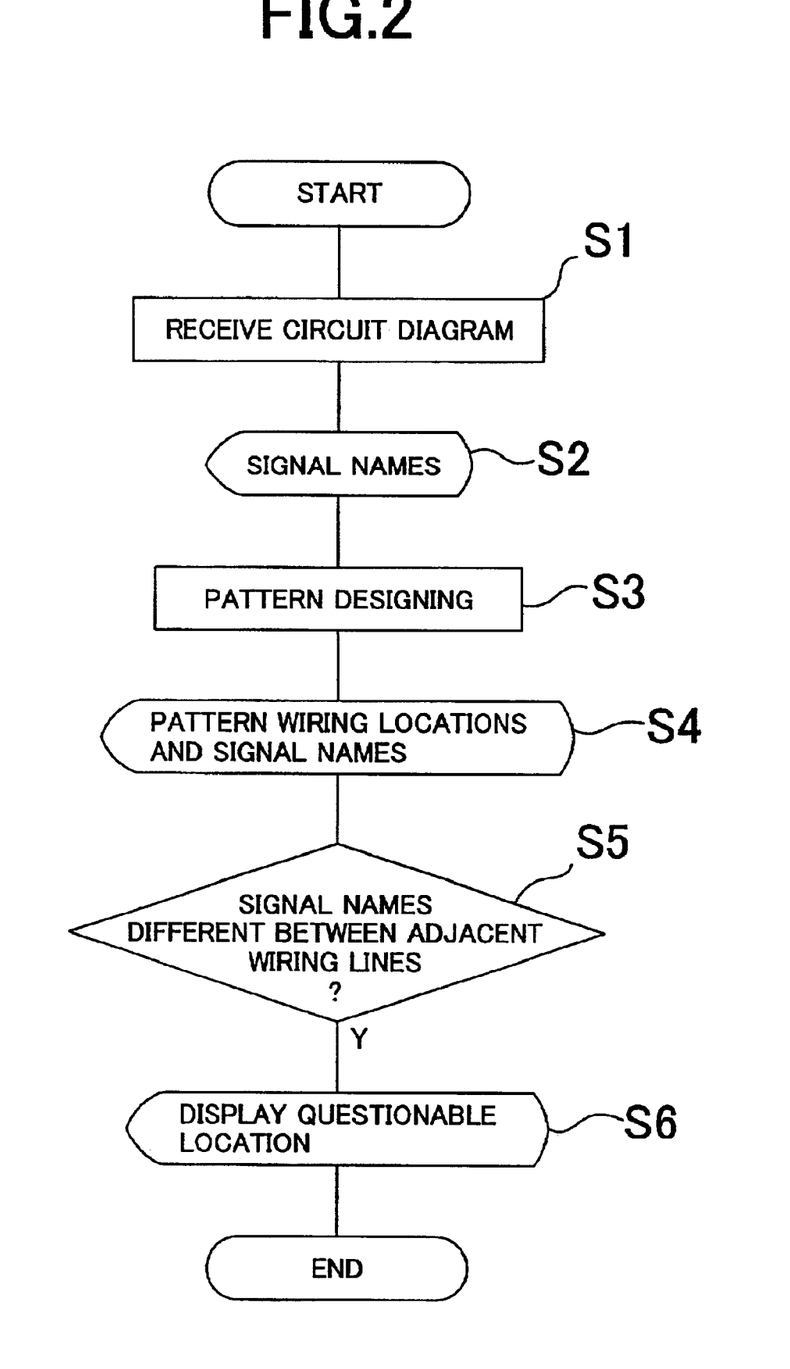
FIG. 2 is a flow chart illustrating a printed board designing method executed by the printed board designing apparatus of FIG. 1.

Referring first to FIG. 2, a circuit diagram corresponding to wiring line information of a circuit is inputted to the inputting section 11 based on operation of an operator, and signal name data representative of a voltage, a type and a frequency of a signal to flow in each of the wiring lines in the circuit diagram is applied to the pertaining wiring line and circuit diagram data L are outputted (steps S1 and S2; circuit diagram inputting step).

Figure 3:
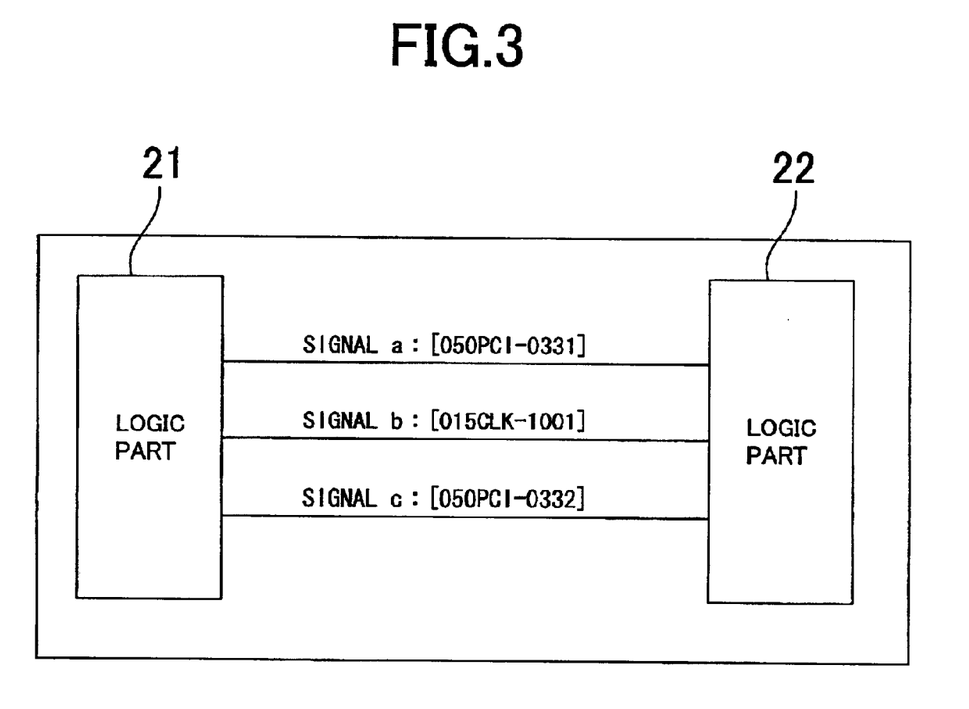
FIG. 3 is a diagrammatic view illustrating signal name data applied to wiring lines by the printed board designing apparatus of FIG. 1.

Each of the signal name data is displayed in the form of "XY-ZN" on the display section 14 where X is the voltage level, Y the signal type, Z the frequency and N the signal number. For example, where signals a, b and c are signaled from a logic part 21 to another logic part 22 as seen in FIG. 3, if the voltage level of the signal a is 5.0 V, the type is the PCI (Peripheral Component Interconnect) and the frequency is 33 MHz, then the signal name data is represented as [050PCI-0331]. Meanwhile, if the voltage level of the signal b is 1.5 V, the type is the CLK (clock) and the frequency is 100 MHz, then the signal name data is represented as [015CLK-1001]. If the voltage level of the signal c is 5.0 V, the type is the PCI and the frequency is 33 MHz, then the signal name data is represented as [050PCI-0332].

Figure 4:
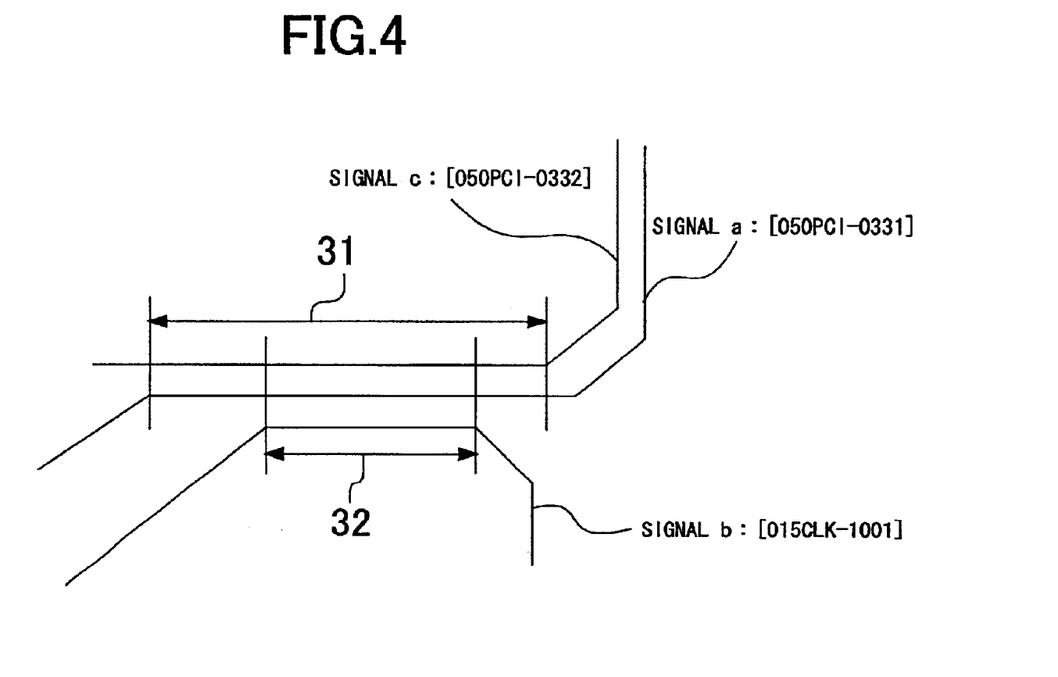
FIG. 4 is a diagrammatic view illustrated patterns and signal name data designed by the printed board designing apparatus of FIG. 1.

The pattern designing section 12 receives the circuit diagram data L as input data thereto and designs patterns corresponding to the individual wiring lines in the circuit diagram based on the received circuit diagram such that no unnecessary inductance component or no unnecessary resistance component may appear. Then, the pattern designing section 12 applies the signal name data to the individual patterns as seen in FIG. 4 to produce pattern design data M, and the pattern design data M are supplied through the crosstalk occurrence discrimination section 13 to and displayed on the display section 14 (steps S3 and S4; pattern designing step).

Figure 5:
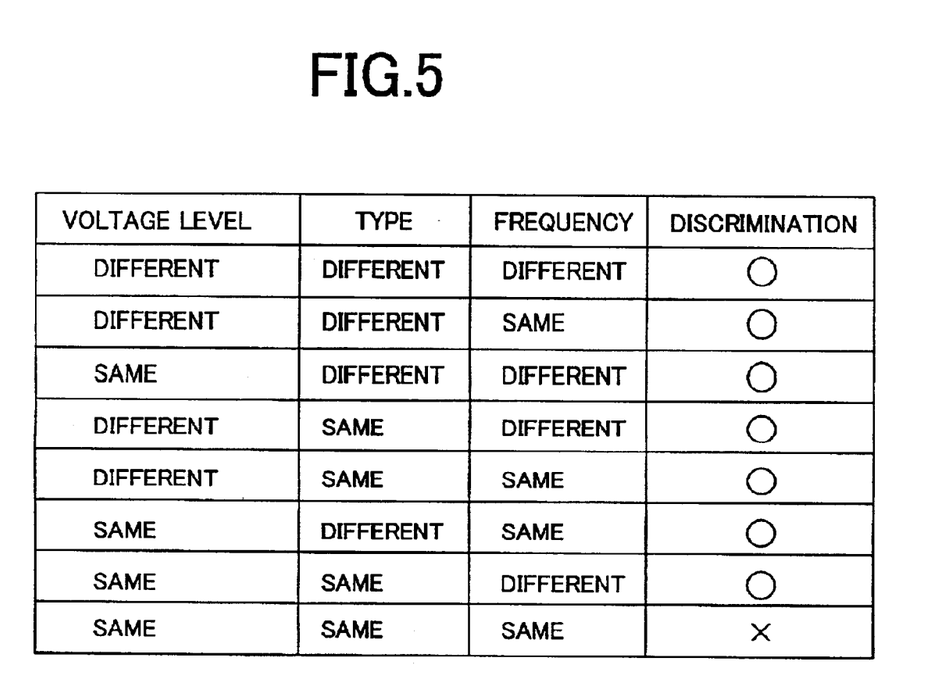
FIG. 5 is a view illustrating criteria used for discrimination of occurrence of crosstalk by the printed board designing apparatus of FIG. 1.
Figure 6:
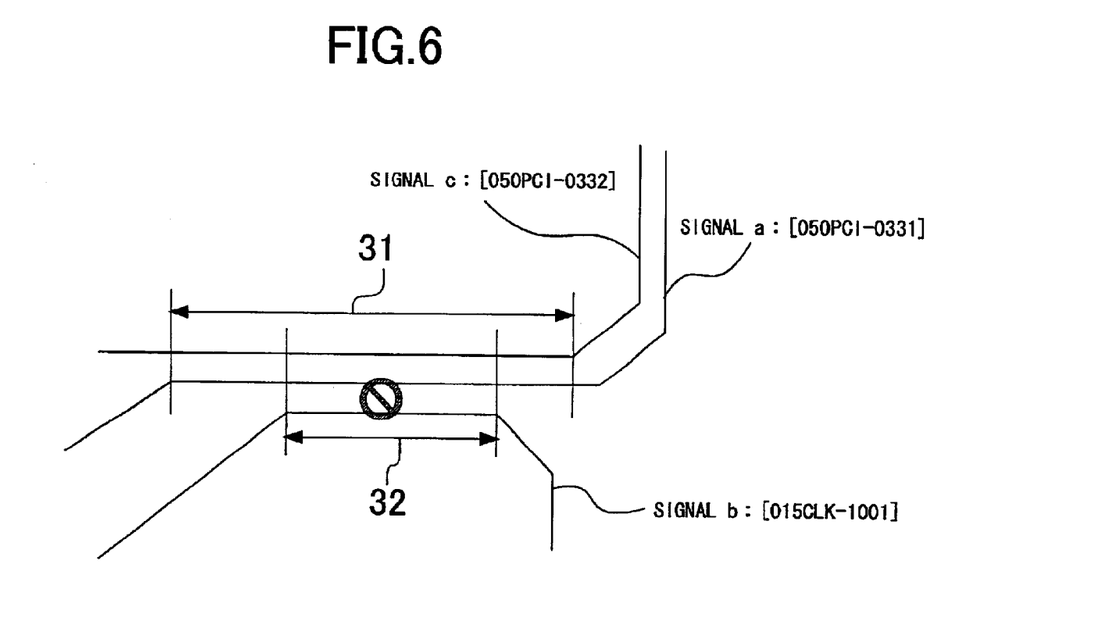
FIG. 6 is a diagrammatic view showing a mark displayed at a location at which crosstalk occurs in the designed patterns shown in FIG. 4.

The crosstalk occurrence discrimination section 13 compares the signals to flow in each two adjacent ones of the patterns in terms of the voltage, type and frequency based on such criteria as illustrated in FIG. 5. Thus, if the signals are different from each other at least in one of the factors of the voltage, type and frequency, then the cross talk occurrence discrimination section 13 discriminates occurrence of crosstalk (step S5; crosstalk occurrence discrimination step). Thus, in the case illustrated, the crosstalk occurrence discrimination section 13 discriminates that crosstalk will occur in a region in which a pattern 31 and another pattern 32 in FIG. 4 are positioned adjacent each other and produces crosstalk data N, and a crosstalk possibility mark 33 is displayed at a location of the region on the display of the display section 14 as seen in FIG. 6 (step S6; questionable location displaying step). Thereafter, the operator will perform a process for preventing the possible crosstalk, for example, by adjusting the gap between the patterns 31 and 32 in the region in which the crosstalk is discriminated to occur.

As described above, since the crosstalk occurrence discrimination section 13 compares signals to flow in two adjacent ones of patterns with each other in terms of the voltage, type and frequency and discriminates occurrence of crosstalk when the signals are different from each other in at least one of the factors of the voltage, type and frequency, a printed board which prevents possible occurrence of crosstalk in a circuit in which various signals of high frequencies are to flow can be designed.

It is to be noted that, although occurrence of crosstalk on the surface of a printed board is described above in connection with the preferred embodiment of the present invention, the present invention can be applied also where crosstalk may occur between different layers of a multilayer circuit board. Further, the present invention can be applied not only to such a printed circuit board on which logic parts (21 and 22) are mounted but also, for example, to a printed board of an analog circuit and a printed board provided in the inside of a semiconductor device.

While a preferred embodiment of the present invention has been described using specific terms, such description is for illustrative purposes only, and it is to be understood that changes and variations may be made without departing from the spirit or scope of the following claims.

What is claimed is:

1. A printed board designing apparatus for receiving a circuit diagram corresponding to information of wiring lines of a circuit and designing patterns corresponding to the individual wiring lines of the circuit diagram, comprising:

crosstalk occurrence discrimination means for comparing signals to flow adjacent to each other in the patterns with each other in terms of a voltage, a type, and a frequency of each of the signals and discriminating occurrence of crosstalk when the signals are different from each other with respect to at least one of the voltage, the type, and the frequency; and display means for displaying the designed patterns and displaying a predetermined mark at a location of the display of the design patterns at which the crosstalk occurrence discrimination means has discriminated occurrence of the crosstalk.

2. A printed board designing apparatus for receiving a circuit diagram corresponding to information of wiring lines of a circuit and designing patterns corresponding to the individual wiring lines of the circuit diagram, comprising:

crosstalk occurrence discrimination means for comparing signals to flow in each two adjacent ones of the patterns with each other in terms of a voltage, a type and a frequency and discriminating occurrence of crosstalk when the signals are different from each other in terms of at least one of the factors of the voltage, type and frequency; and display means for displaying the designed patterns and displaying a predetermined mark at a location of the display of the design patterns at which the crosstalk occurs.

3. A printed board designing apparatus, comprising:

circuit diagram inputting means for inputting a circuit diagram corresponding to information of wiring lines of a circuit and applying, to each of the wiring lines in the circuit diagram, signal name data representative of a characteristic of a signal to flow in the wiring line;

pattern designing means for designing patterns corresponding to the wiring lines based on the circuit diagram and applying the pertaining signal name data to the designed patterns;

crosstalk occurrence discrimination means for comparing the signal name data corresponding to each two adjacent ones of the patterns and discriminating occurrence of crosstalk when the signal name data represent signals whose characteristics are different from each other; and display means for displaying the designed patterns and displaying a predetermined mark at a location of the display of the design patterns at which the crosstalk occurs.

4. A printed board designing apparatus, comprising:

circuit diagram inputting means for inputting a circuit diagram corresponding to information of wiring lines of a circuit and applying, to each of the wiring lines in the circuit diagram, signal name data representative of a voltage, a type and a frequency of a signal to flow in the wiring line;

pattern designing means for designing patterns corresponding to the wiring lines based on the circuit diagram and applying the pertaining signal name data to the designed patterns;

crosstalk occurrence discrimination means for comparing the signal name data corresponding to each two adjacent ones of the patterns in terms of the voltage, type and frequency and discriminating occurrence of crosstalk when the signals are different from each other in terms of at least one of the voltage, type and frequency; and display means for displaying the designed patterns and the signal name data and displaying a predetermined mark at a location of the display of the design patterns at which the crosstalk occurs.

5. A printed board designing method for a printed board designing apparatus which receives a circuit diagram corresponding to information of wiring lines of a circuit and designs patterns corresponding to the individual wiring lines of the circuit diagram, comprising:

a crosstalk occurrence discrimination step of comparing signals to flow adjacent to each other in the patterns with each other in terms of a voltage, a type and a frequency of each of the signals and discriminating occurrence of crosstalk when the signals are different from each other with respect to at least one of the voltage, the type, and the frequency; and a displaying step of displaying the designed patterns and displaying a predetermined mark at a location of the display of the design patterns at which the crosstalk occurrence discrimination means has discriminated occurrence of the crosstalk.

6. A printed board designing method for a printed board designing apparatus which receives a circuit diagram corresponding to information of wiring lines of a circuit and designs patterns corresponding to the individual wiring lines of the circuit diagram, comprising:

a crosstalk occurrence discrimination step of comparing signals to flow in each two adjacent ones of the patterns with each other in terms of a voltage, a type and a frequency and discriminating occurrence of crosstalk when the signals are different from each other in terms of at least one of the factors of the voltage, type and frequency; and a displaying step of displaying the designed patterns and displaying a predetermined mark at a location of the display of the design patterns at which the crosstalk occurs.

7. A printed board designing method for a printed board designing apparatus, comprising:

a circuit diagram inputting step of inputting a circuit diagram corresponding to information of wiring lines of a circuit and applying, to each of the wiring lines in the circuit diagram, signal name data representative of a characteristic of a signal to flow in the wiring line;

a pattern designing step of designing patterns corresponding to the wiring lines based on the circuit diagram and applying the pertaining signal name data to the designed patterns;

a crosstalk occurrence discrimination step of comparing the signal name data corresponding to each two adjacent ones of the patterns and discriminating occurrence of crosstalk when the signal name data represent signals whose characteristics are different from each other; and a displaying step of displaying the designed patterns and displaying a predetermined mark at a location of the display of the design patterns at which the crosstalk occurs.

8. A printed board designing method for a printed board designing apparatus, comprising:

a circuit diagram inputting step of inputting a circuit diagram corresponding to information of wiring lines of a circuit and applying, to each of the wiring lines in the circuit diagram, signal name data representative of a voltage, a type and a frequency of a signal to flow in the wiring line;

a pattern designing step of designing patterns corresponding to the wiring lines based on the circuit diagram and applying the pertaining signal name data to the designed patterns;

a crosstalk occurrence discrimination step of comparing the signal name data corresponding to each two adjacent ones of the patterns in terms of the voltage, type and frequency and discriminating occurrence of crosstalk when the signals are different from each other in terms of at least one of the voltage, type and frequency; and a displaying step of displaying the designed patterns and the signal name data and displaying a predetermined mark at a location of the display of the design patterns at which the crosstalk occurs.

9. A recording medium on which a control program for a printed board designing apparatus which receives a circuit diagram corresponding to information of wiring lines of a circuit and designs patterns corresponding to the individual wiring lines of the circuit diagram is recorded, the control program comprising:

a crosstalk occurrence discrimination step of comparing signals to flow adjacent to each other in the patterns with each other in terms of a voltage, a type, and a frequency of each of the signals and discriminating occurrence of crosstalk when the signals are different from each other with respect to at least one of the voltage, the type, and the frequency; and a displaying step of displaying the designed patterns and displaying a predetermined mark at a location of the display of the design patterns at which the crosstalk occurrence discrimination means has discriminated occurrence of the crosstalk.

10. A recording medium on which a control program for a printed board designing apparatus which receives a circuit diagram corresponding to information of wiring lines of a circuit and designs patterns corresponding to the individual wiring lines of the circuit diagram is recorded, the control program comprising:

a crosstalk occurrence discrimination step of comparing signals to flow in each two adjacent ones of the patterns with each other in terms of a voltage, a type and a frequency and discriminating occurrence of crosstalk when the signals are different from each other in terms of at least one of the factors of the voltage, type and frequency; and a displaying step of displaying the designed patterns and displaying a predetermined mark at a location of the display of the design patterns at which the crosstalk occurs.

11. A recording medium on which a control program for a printed board designing apparatus is recorded, the control program comprising:

a circuit diagram inputting step of inputting a circuit diagram corresponding to information of wiring lines of a circuit and applying, to each of the wiring lines in the circuit diagram, signal name data representative of a characteristic of a signal to flow in the wiring line;

a pattern designing step of designing patterns corresponding to the wiring lines based on the circuit diagram and applying the pertaining signal name data to the designed patterns;

a crosstalk occurrence discrimination step of comparing the signal name data corresponding to each two adjacent ones of the patterns and discriminating occurrence of crosstalk when the signal name data represent signals whose characteristics are different from each other; and a displaying step of displaying the designed patterns and displaying a predetermined mark at a location of the display of the design patterns at which the crosstalk occurs.

12. A recording medium on which a control program for a printed board designing apparatus is recorded, the control program comprising:

a circuit diagram inputting step of inputting a circuit diagram corresponding to information of wiring lines of a circuit and applying, to each of the wiring lines in the circuit diagram, signal name data representative of a voltage, a type and a frequency of a signal to flow in the wiring line;

a pattern designing step of designing patterns corresponding to the wiring lines based on the circuit diagram and applying the pertaining signal name data to the designed patterns;

a crosstalk occurrence discrimination step of comparing the signal name data corresponding to each two adjacent ones of the patterns in terms of the voltage, type and frequency and discriminating occurrence of crosstalk when the signals are different from each other in terms of at least one of the voltage, type and frequency; and a displaying step of displaying the designed patterns and the signal name data and displaying a predetermined mark at a location of the display of the design patterns at which the crosstalk occurs.

* * * * *